(12) United States Patent
Tang

(10) Patent No.: US 12,193,275 B2
(45) Date of Patent: Jan. 7, 2025

(54) DISPLAY BACKPLANE AND MOBILE TERMINAL

(71) Applicant: SHENZHEN CHINA STAR OPTOELECTRONICS SEMICONDUCTOR DISPLAY TECHNOLOGY CO., LTD., Guangdong (CN)

(72) Inventor: Jia Tang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/622,846

(22) PCT Filed: Dec. 22, 2021

(86) PCT No.: PCT/CN2021/140567
§ 371 (c)(1),
(2) Date: Dec. 26, 2021

(87) PCT Pub. No.: WO2023/108765
PCT Pub. Date: Jun. 22, 2023

(65) Prior Publication Data
US 2024/0040840 A1 Feb. 1, 2024

(30) Foreign Application Priority Data
Dec. 16, 2021 (CN) .......................... 202111544151.X

(51) Int. Cl.
*H10K 59/122* (2023.01)
*H10K 59/80* (2023.01)

(52) U.S. Cl.
CPC ..... *H10K 59/122* (2023.02); *H10K 59/80518* (2023.02); *H10K 59/878* (2023.02)

(58) Field of Classification Search
CPC .......... H10K 59/122; H10K 59/80518; H10K 59/878; H10K 59/123; H10K 59/126; H01L 51/52
See application file for complete search history.

(56) References Cited

U.S. PATENT DOCUMENTS 10,170,526 B1 1/2019 Yang
2018/0240822 A1* 8/2018 Lee ..................... H01L 27/1255

FOREIGN PATENT DOCUMENTS

CN 1543285 A 11/2004
CN 104885252 A 9/2015
(Continued)

OTHER PUBLICATIONS

International Search Report in International application No. PCT/CN2021/140567, mailed on Sep. 14, 2022.
(Continued)

*Primary Examiner* — Donald L Raleigh
(74) *Attorney, Agent, or Firm* — PV IP PC; Wei Te Chung

(57) ABSTRACT

A display backplane and a mobile terminal are provided. The display backplane includes a substrate, a plurality of pixel units disposed on the substrate, and a barrier layer disposed on the substrate. The pixel unit includes a reflection unit, the barrier layer includes a plurality of barriers arranged between two adjacent pixel units, and two adjacent reflection units are separately provided by the barriers.

15 Claims, 1 Drawing Sheet

(56) References Cited

FOREIGN PATENT DOCUMENTS

| CN | 111900194 A | 11/2020 |
| CN | 113314682 A | 8/2021 |

OTHER PUBLICATIONS

Written Opinion of the International Search Authority in International application No. PCT/CN2021/140567, mailed on Sep. 14, 2022.

* cited by examiner

DISPLAY BACKPLANE AND MOBILE TERMINAL

FIELD OF INVENTION

The present application relates to the field of display technologies, and more particularly to a display backplane and a mobile terminal.

BACKGROUND OF INVENTION

A light emitting mode of OLED display can be divided into two types: top emitting and bottom emitting. An aperture ratio of the top emitting is higher than an aperture ratio of the bottom emitting, which is currently a main development direction of OLED displays.

At this stage, an anode of a top emitting OLED usually needs to be provided with a layer of reflective metal to enhance a reflection effect of light. However, due to instability of the reflective metal, when anodes corresponding to adjacent pixels are working, the reflective metal is prone to hydrolysis and migration due to the influence of water vapor and potential difference. Eventually, it accumulates in the form of oxide and presents a dispersive gel shape, causing short circuits between adjacent pixels, which affects a display quality.

Technical Problem

A current top emitting OLED has the problem that a reflective metal of adjacent pixels is prone to hydrolysis and migration, which causes short circuits and affects a display quality.

SUMMARY OF INVENTION

The present application provides a display backplane and a mobile terminal to improve the technical problem that a current top emitting OLED is caused by instability of a reflective metal and adjacent pixels are short-circuited, which affects a display quality.

In order to solve the above technical problems, the technical solutions provided by this application are as follows: This application provides a display backplane, comprising:
- a substrate;
- a plurality of pixel units disposed on the substrate, the pixel units comprising reflection units; and
- a barrier layer disposed on the substrate, wherein the barrier layer comprises a plurality of barriers disposed between two adjacent pixel units, and two adjacent reflection units are separately disposed by the barriers.

In the display backplane of this application, the pixel unit further comprises an anode unit disposed on the reflection unit.

In the display backplane of this application, the barrier is attached to the reflection unit and the anode unit.

In the display backplane of this application, the barrier comprises a first barrier part and a second barrier part.

In the display backplane of this application, the first barrier part is disposed on opposite sides of two adjacent pixel units.

In the display backplane of this application, the second barrier part is disposed on a side surface of the anode unit away from the reflection unit.

In the display backplane of this application, the barrier layer comprises a barrier disposed in an interval between two adjacent pixel units.

In the display backplane of this application, the barrier is spaced apart from two adjacent pixel units.

In the display backplane of this application, the pixel unit further comprises an anode unit disposed on the reflection unit.

In the display backplane of this application, in a light emitting direction of the display backplane, a height of the barrier is greater than a sum of a height of the reflection unit and a height of the anode unit.

In the display backplane of this application, the display backplane further comprises a pixel isolation column disposed between two adjacent pixel units.

In the display backplane of this application, the barrier is located in the pixel isolation column.

In the display backplane of this application, the pixel unit further comprises a light emitting unit disposed on the anode unit.

In the display backplane of this application, the pixel unit further comprises a cathode unit disposed on the light emitting unit.

In the display backplane of this application, the cathode units of the plurality of pixel units are continuously arranged to form a continuous cathode layer.

In the display backplane of this application, the continuous cathode layer covers a plurality of pixel isolation columns.

In the display backplane of this application, in a light emitting direction of the display backplane, a height of the pixel isolation column is greater than a sum of heights of the reflection unit, the anode unit, and the light emitting unit.

In the display backplane of this application, in a light emitting direction of the display backplane, a thickness of the barrier layer is greater than or equal to a thickness of the reflection unit.

In the display backplane of this application, in the light emitting direction of the display backplane, the thickness of the barrier layer is less than or equal to twice the thickness of the reflection unit.

The present application further provides a mobile terminal comprising a terminal main body and the above display backplane, and the display backplane and the terminal main body are combined into one body.

Beneficial Effect

In the present application, a barrier is arranged between two adjacent pixel units, so that reflection units of two adjacent pixel units are separately arranged by the barrier. Even if a metal material in the reflection unit undergoes hydrolysis, migration, etc. due to factors such as water vapor, the barrier can prevent migration of particles from disassociating and accumulating in the reflection unit of an adjacent pixel. Therefore, a short-circuit phenomenon of adjacent pixels is avoided or greatly reduced, and a display quality of the display panel is effectively improved.

DESCRIPTION OF DRAWINGS

In order to illustrate the technical solutions more clearly in the embodiments of the present application, the following will briefly introduce the drawings that need to be used in the description of the embodiments. Obviously, the drawings in the following description are only some embodiments of the present application. For those skilled in the art, without creative work, other drawings can be obtained based on these drawings.

DESCRIPTION OF REFERENCE NUMBER

Figure 1:
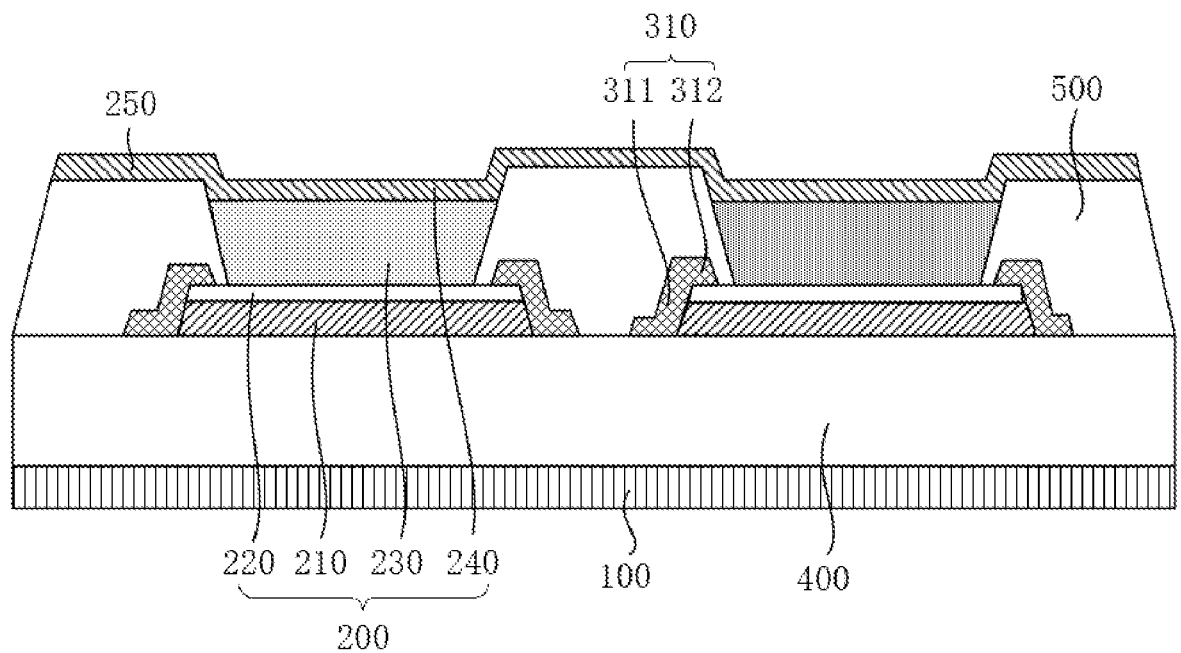
FIG. 1 is a schematic diagram of a first structure of a display backplane according to the present application.

Substrate 100, pixel unit 200, reflection unit 210, anode unit 220, light emitting unit 230, cathode unit 240, continuous cathode layer 250, barrier layer 300, barrier 310, first barrier part 311, second barrier part 312, planarization layer 400, pixel isolation column 500.

DETAILED DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application. In addition, it should be understood that the specific implementations described here are only used to illustrate and explain the application and are not used to limit the application. In this application, if no explanation is made to the contrary, the orientation words used such as "upper" and "lower" generally refer to the upper and lower directions of the device in actual use or working state, and specifically refer to the drawing directions in the drawings. "Inner" and "outer" refer to the outline of the device.

A light emitting mode of OLED display can be divided into two types: top emitting and bottom emitting. An aperture ratio of the top emitting is higher than an aperture ratio of the bottom emitting, which is currently a main development direction of OLED displays.

At this stage, an anode of a top emitting OLED usually needs to be provided with a layer of reflective metal to enhance a reflection effect of light. Due to its high reflectivity, Ag is currently the most widely used reflective material. However, due to instability of Ag itself, it cannot be passivated to form an oxide film. Therefore, when anodes corresponding to adjacent pixels are working, Ag is prone to hydrolysis and migration due to an influence of water vapor and potential difference. Eventually, it accumulates in the form of Ag2O and presents a dispersed colloidal shape, causing short circuits between adjacent pixels, which affects a display quality. This application proposes the following solutions based on the above technical problems.

Figure 2:
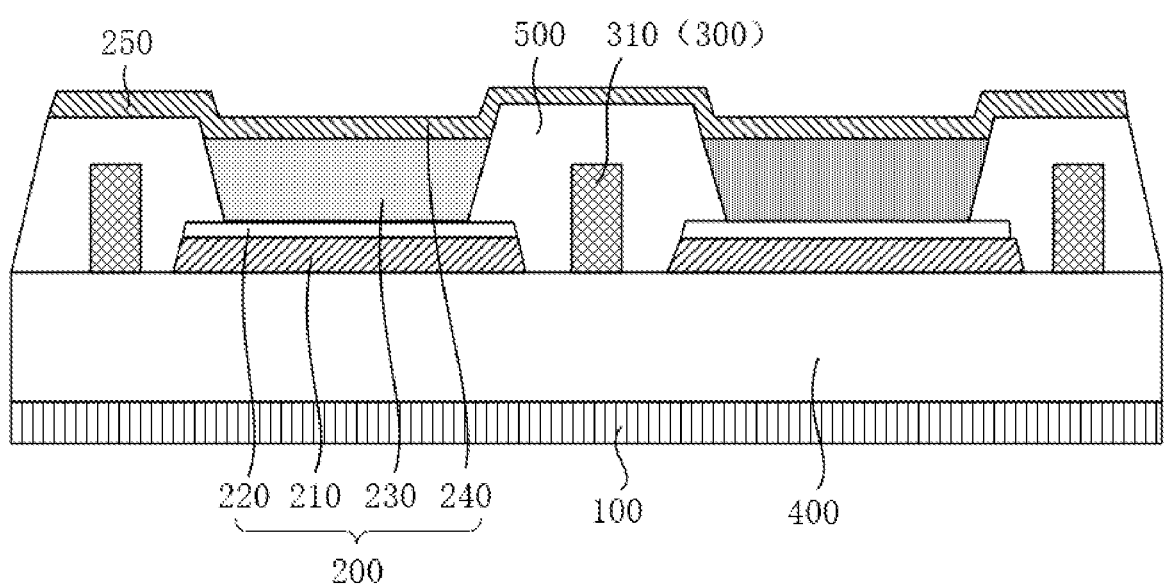
FIG. 2 is a schematic diagram of a second structure of a display backplane according to the present application.

Referring to FIG. 1 and FIG. 2, the present application provides a display backplane, comprising:
  a substrate 100;
  a plurality of pixel units 200 disposed on the substrate 100, the pixel units 200 comprising reflection units 210; and
  a barrier layer 300 disposed on the substrate 100, wherein the barrier layer 300 comprises a plurality of barriers 310 disposed between two adjacent pixel units 200, and two adjacent reflection units 210 are separately disposed by the barriers 310.

In the present application, the barrier 310 is arranged between two adjacent pixel units 200, so that reflection units 210 of two adjacent pixel units 200 are separately arranged by the barrier 310. Even if a metal material in the reflection unit undergoes hydrolysis, migration, etc. due to factors such as water vapor, the barrier 310 can prevent migration of particles from disassociating and accumulating in the reflection unit 210 of an adjacent pixel. Therefore, a short-circuit phenomenon of adjacent pixels is avoided or greatly reduced, and a display quality of the display panel is effectively improved.

The technical solution of the present application will now be described in conjunction with specific embodiments. It should be noted that the order of description in the following embodiments is not meant to limit the preferred order of the embodiments.

In the display backplane of the present application, the substrate 100 may be a glass substrate or a polyimide substrate or the like.

In this embodiment, the display backplane may further include an array of driving layers (not shown in the figure) disposed on the glass substrate. The array driving layer includes a plurality of thin film transistors to drive the pixel unit 200 to emit light. A plurality of the pixel units 200 are arranged in an array on the substrate 100. The plurality of pixel units 200 correspond to the thin film transistors in the array driving layer in a one-to-one correspondence.

In this embodiment, the thin film transistor in the array driving layer may be one of a low temperature polysilicon thin film transistor, an oxide semiconductor thin film transistor, and a solid phase crystallization polysilicon thin film transistor. The thin film transistor may be one of a top-gate thin film transistor and a bottom-gate thin film transistor.

In this embodiment, the display backplane may further include a planarization layer 400 disposed on the array driving layer, and the planarization layer 400 may be made of insulating materials such as SiOx and SiNx.

In this embodiment, the barrier layer 300 may be made of a dense film material with high barrier properties, such as a film material such as oxide (AlOx). In this embodiment, by using the barrier layer 300 made of a dense film material with high barrier properties, the barrier layer 300 can have a good barrier effect on migrating particles. This effectively prevents short circuit problems caused by ion migration between the reflective units 210 of adjacent pixels.

Refer to FIG. 1, which is a schematic diagram of a first structure of a display backplane according to the present application. In the display backplane of the present application, the pixel unit 200 further includes an anode unit 220 disposed on the reflection unit 210. The barrier 310 is attached to the reflection unit 210 and the anode unit 220.

In this embodiment, the anode unit 220 may be made of a transparent material with a high work function, such as indium tin oxide material. Indium tin oxide has a transmittance of more than 80% in a wavelength range of 400 nm to 1000 nm and has a higher transmittance in a near ultraviolet region.

In this embodiment, the barrier 310 is attached to the reflection unit 210 and the anode unit 220. It can be understood that the barrier 310 is disposed on opposite sides of the two adjacent light emitting units 230. Furthermore, the barriers 310 on two adjacent light emitting units 230 are separately arranged to further improve a barrier effect.

In this embodiment, the barrier 310 can be provided on a peripheral side of each light emitting unit 230 to separate each light emitting unit 230 separately and block a migration of particles between pixels. Moreover, the barrier 310 is attached to the reflection unit 210 and the anode unit 220. Therefore, migrating particles can be effectively restrained. Even if Ag is hydrolyzed to form Ag2O, it cannot be dissociated and accumulated between neighboring pixels, making it difficult to generate a continuous path. Thereby, a short-circuit problem of neighboring pixels is better avoided, and a display quality is further stabilized.

Refer to FIG. 1, in the display backplane of the present application, the barrier 310 includes a first barrier part 311 and a second barrier part 312. The first barrier part 311 is disposed on opposite side surfaces of the two adjacent pixel units 200, and the second barrier part 312 is disposed on a side surface of the anode unit 220 away from the reflection unit 210.

In this embodiment, the first barrier part 311 and the second barrier part 312 may be integrally formed. The first barrier part 311 and the second barrier part 312 may be disposed at edge positions of the reflection unit 210 and the anode unit 220 by dispensing glue.

In this embodiment, the second barrier part 312 may only cover the side edge of the anode unit 220 away from the reflection unit 210, so as to reduce a space obstruction to the light emitting unit 230 on the anode unit 220. This is beneficial to enlarge an area of the light emitting unit 230 and improve a light emitting effect.

In this embodiment, by providing the first barrier part 311 and the second barrier part 312, this allows the first barrier part 311 to separate opposite sides of the two adjacent light emitting units 230 to block migration of migrating particles. In addition, the second barrier part 312 can wrap the edge of the anode unit 220 to further protect the anode unit 220. This prevents or reduces the migrating particles from reaching the anode unit 220, thereby improving a barrier effect of the barrier layer 300.

Refer to FIG. 2, which is a schematic diagram of a second structure of a display backplane according to the present application. In the display backplane of the present application, the barrier layer 300 includes barriers 310 arranged in an interval between two adjacent pixel units 200. The shape of the barrier 310 includes, but is not limited to, a rectangle, a trapezoid, an inverted trapezoid, and the like. If the barriers 310 with other shapes and designs have the same effect, they should also fall within the protection scope of the present application.

In this embodiment, a plurality of the barriers 310 may be continuously arranged. That is, a plurality of the barriers 310 may be connected to form a grid structure in the interval area of the pixel unit 200. The pixel unit 200 is located in a grid structure formed by the plurality of barriers 310, so that a separate grid interval is separated for each pixel unit 200, which has a good blocking effect.

In this embodiment, the barrier 310 may be made of inorganic insulating materials, such as SiOx, SiNx, AlOx, and so on.

In this embodiment, the barrier 310 is spaced apart from the two adjacent pixel units 200. This prevents the barrier 310 from directly contacting the pixel unit 200, thereby achieving a better blocking effect. It should be noted that the barrier 310 itself in this embodiment cannot restrain a diffusion of the migrating particles. Instead, difficulty of conducting Ag migration particles between two adjacent pixel units 200 is increased by taking advantage of a space barrier effect.

Refer to FIG. 1 and FIG. 2, in the display backplane of the present application, in a light emitting direction of the display backplane, a height of the barrier 310 is greater than a sum of a height of the reflection unit 210 and a height of the anode unit 220.

In this embodiment, a height of the barrier 310 is greater than a sum of a height of the reflection unit 210 and a height of the anode unit 220. It can be understood that, in a direction parallel to the display backplane, an orthographic projection of the reflection unit 210 and the anode unit 220 on the barrier 310 is located in the barrier 310.

In this embodiment, through the above arrangement, the barrier 310 can be arranged to protrude from two adjacent pixel units 200. Therefore, when the Ag particles migrate, they pass the barrier 310 with a higher height to reach the adjacent pixel unit 200. That is, the difficulty of migration and conduction of Ag particles is increased, and a barrier effect is further improved.

Refer to FIG. 1 and FIG. 2, in the display backplane of the present application, the display backplane further includes a pixel isolation column 500 disposed between two adjacent pixel units 200. The barrier 310 is located in the pixel isolation column 500.

In this embodiment, the pixel isolation column 500 may be made of polyimide polymer material (PI). The plurality of pixel isolation columns 500 constitute a pixel defining layer (or called a pixel defining layer) arranged in the interval of the plurality of pixel units 200.

In this embodiment, the planar shape of the pixel isolation column 500 may be a rectangle, a trapezoid, or the like.

In this embodiment, the pixel isolation column 500 completely fills the space between the plurality of pixel units 200. Further, the pixel isolation column 500 may partially cover the anode units 220 of two adjacent pixel units 200, and the barrier 310 is to be arranged in the interval between two adjacent pixel units 200. Alternatively, the barrier 310 arranged on a peripheral side of the pixel unit 200 is completely covered inside the pixel isolation column 500, and this serves to restrict and fix the barrier 310 and stabilize a barrier effect of the barrier 310.

Referring to FIG. 1 and FIG. 2 in the display backplane of the present application, the pixel unit 200 further includes a light emitting unit 230 disposed on the anode unit 220 and a cathode unit 240 disposed on the light emitting unit 230.

In this embodiment, the light emitting unit 230 may be made of a light emitting material. The light emitting material has high luminous efficiency, and preferably has electron or hole transport properties or both. After vacuum evaporation, a stable and uniform film can be made. Their HOMO (highest occupied molecular orbital) and LUMO (lowest unoccupied molecular orbital) energy should match the characteristics of the corresponding electrode. For example, 8-hydroxyquinoline aluminum (Alq3), an organic material that can be used alone as a light emitting material, can also be used as an electron transport material. For another example, it cannot be used as a light emitting material alone. However, red light dopants, green light dopants, blue light dopants, etc., which can only emit light when doped in another host material.

In this embodiment, the cathode unit 240 can be made of metal unit materials, such as Al, Mg, Ca, etc., or the cathode unit 240 can also be made of alloy materials, such as alloy materials of Al, Mg, and Ca.

In this embodiment, the cathode units 240 of the plurality of pixel units 200 are continuously arranged to form a continuous cathode layer 250. The continuous cathode layer 250 covers a plurality of the pixel isolation columns 500. In this embodiment, a plurality of the cathode units 240 of the pixel units 200 are continuously arranged. In addition, the continuous cathode layer 250 covers a plurality of pixel isolation pillars 500. On the one hand, a patterning process of the continuous cathode layer 250 can be omitted, and a manufacturing process can be simplified to reduce the cost. On the other hand, a plurality of the cathode units 240 can also be connected to form a whole. Thus, a voltage stability on the cathode units 240 of the plurality of pixel units 200 is maintained, and a uniformity of light emission is improved.

Refer to FIG. 2, in the display backplane of the present application, in the light emitting direction of the display backplane, the height of the pixel isolation column 500 is greater than the sum of the heights of the reflection unit 210, the anode unit 220, and the light emitting unit 230. That is, in a direction parallel to the display backplane, an orthographic projection of the reflection unit 210, the anode unit 220 and the light emitting unit 230 on the pixel isolation column 500 is located in the pixel isolation column 500.

In this embodiment, through the above configuration, the pixel isolation column 500 can protrude from the light emitting unit 230 of two adjacent pixel units 200. Therefore, the multiple pixel units 200 can be better defined, and the problem of pixel crosstalk between adjacent light emitting units 230 can be alleviated to a certain extent.

Refer to FIG. 1 and FIG. 2, in the display backplane of the present application, in the light emitting direction of the display backplane, the thickness of the barrier layer 300 is greater than or equal to the thickness of the reflection unit 210 so that the barrier layer 300 can be higher than the height of the reflection unit 210. It has a better blocking effect on the reflection units 210 of two adjacent pixel units 200.

In this embodiment, the thickness of the barrier layer 300 is less than or equal to twice the thickness of the reflective unit 210, so that the barrier layer 300 maintains a proper height. It can not only achieve a good barrier effect, but also prevent the thickness of the barrier layer 300 from being too large, resulting in the pixel isolation column 500 covering the barrier 310 from being too high. Thereby, it is beneficial to reduce the thickness of the display backplane and realize lightness and thinness.

An embodiment of the present application also provides a mobile terminal including a terminal body and the above-mentioned display backplane. The display backplane and the terminal body are combined into one body. In this embodiment, the mobile terminal may be a smart display device such as a mobile phone, a computer, or a watch.

In the present application, the barrier 310 is arranged between two adjacent pixel units 200, so that reflection units 210 of two adjacent pixel units 200 are separately arranged by the barrier 310. Even if a metal material in the reflection unit undergoes hydrolysis, migration, etc. due to factors such as water vapor, the barrier 310 can prevent migration of particles from disassociating and accumulating in the reflection unit 210 of an adjacent pixel. Therefore, a short-circuit phenomenon of adjacent pixels is avoided or greatly reduced, and a display quality of the display panel is effectively improved.

The above describes in detail a display backplane and a mobile terminal provided by the embodiments of the present application. Specific examples are used in this article to illustrate the principle and implementation of this application. The description of the above embodiments is only used to help understand the method and core idea of the present application. Further, for those skilled in the art, based on the idea of this application, there will be changes in the specific implementation and the scope of application. In summary, the content of this specification should not be construed as a limitation to this application.

What is claimed is:

1. A display backplane, comprising:
    a substrate;
    a plurality of pixel units disposed on the substrate, the pixel units comprising reflection units; and
    a barrier layer disposed on the substrate, wherein the barrier layer comprises a plurality of barriers disposed between two adjacent pixel units, and two adjacent reflection units are separately disposed by the barriers;
    wherein the barrier layer comprises a barrier disposed in an interval between two adjacent pixel units;
    wherein the barrier is spaced apart from two adjacent pixel units;
    wherein the display backplane further comprises a pixel isolation column disposed between two adjacent pixel units;
    wherein the barrier is located in the pixel isolation column.

2. The display backplane according to claim 1, wherein the pixel unit further comprises an anode unit disposed on the reflection unit.

3. The display backplane according to claim 2, wherein the barrier is attached to the reflection unit and the anode unit.

4. The display backplane according to claim 3, wherein the barrier comprises a first barrier part and a second barrier part.

5. The display backplane according to claim 4, wherein the first barrier part is disposed on opposite sides of two adjacent pixel units.

6. The display backplane according to claim 5, wherein the second barrier part is disposed on a side surface of the anode unit away from the reflection unit.

7. A mobile terminal, comprising a terminal main body and the display backplane according to claim 1, wherein the display backplane and the terminal main body are combined into one body.

8. The display backplane according to claim 1, wherein the pixel unit further comprises an anode unit disposed on the reflection unit.

9. The display backplane according to claim 8, wherein in a light emitting direction of the display backplane, a height of the barrier is greater than a sum of a height of the reflection unit and a height of the anode unit.

10. The display backplane according to claim 1, wherein the pixel unit further comprises a light emitting unit disposed on the anode unit.

11. The display backplane according to claim 10, wherein the pixel unit further comprises a cathode unit disposed on the light emitting unit.

12. The display backplane according to claim 11, wherein the cathode units of the plurality of pixel units are continuously arranged to form a continuous cathode layer.

13. The display backplane according to claim 12, wherein the continuous cathode layer covers a plurality of pixel isolation columns.

14. The display backplane according to claim 13, wherein in a light emitting direction of the display backplane, a height of the pixel isolation column is greater than a sum of heights of the reflection unit, the anode unit, and the light emitting unit.

15. A display backplane, comprising:
    a substrate;
    a plurality of pixel units disposed on the substrate, the pixel units comprising reflection units; and a barrier layer disposed on the substrate, wherein the barrier layer comprises a plurality of barriers disposed between two adjacent pixel units, and two adjacent reflection units are separately disposed by the barriers;

wherein in a light emitting direction of the display backplane, a thickness of the barrier layer is greater than or equal to a thickness of the reflection unit;

wherein in the light emitting direction of the display backplane, the thickness of the barrier layer is less than or equal to twice the thickness of the reflection unit.

* * * * *